United States Patent [19]

Tripp

[11] 3,860,920

[45] Jan. 14, 1975

[54] POSITION-INDICATING SYSTEM

[75] Inventor: Robert W. Tripp, Tuckahoe, N.Y.

[73] Assignee: Inductosyn Corporation, Valhalla, N.Y.

[22] Filed: June 20, 1973

[21] Appl. No.: 371,914

[52] U.S. Cl....... 340/347 SY, 318/661, 340/347 AD

[51] Int. Cl............................................ H03k 13/02

[58] Field of Search............... 340/347 AD, 347 SY; 235/151.11, 151.32; 318/603, 656–661

[56] References Cited

UNITED STATES PATENTS

| | | | |
|---|---|---|---|
| 3,247,504 | 4/1966 | Emmerich | 340/347 SY |
| 3,531,800 | 9/1970 | Brescia | 340/347 AD |
| 3,537,102 | 10/1970 | Baratto | 340/347 AD |
| 3,585,630 | 6/1971 | Pomella et al. | 340/347 AD |
| 3,594,783 | 7/1971 | Bullock | 340/347 AD |
| 3,609,308 | 9/1971 | Lemon et al. | 235/151.11 |
| 3,673,585 | 6/1972 | Tripp | 340/347 SY |
| 3,696,398 | 10/1972 | Pomella et al. | 340/347 AD |

*Primary Examiner*—Charles D. Miller
*Attorney, Agent, or Firm*—John L. Downing; William E. Beatty

[57] ABSTRACT

A position-indicating system is comprised of a data element having two relatively rotatable members, a control unit and a tracking pulse generator all connected in a closed loop. The control unit provides to the data element displacement signals representative of an indicated angular displacement between the members. In response thereto, the data element provides an error signal having an amplitude representative of the difference between the indicated and the actual angular displacements. The error signal is fed to the pulse generator which senses the error signal having an amplitude greater than a threshold level. In response thereto, the pulse generator provides to the control unit a single tracking pulse concurrently with a displacement direction signal. Additionally, the pulse generator provides to the control unit a first group of tracking pulses concurrently with a velocity direction signal. The number of pulses in the first group is proportional to the integral of a digitally modified difference between the indicated and the actual angular displacements, the velocity direction signal being representative of the sign of the integral. The pulse generator also senses the error signal having an amplitude greater than an override amplitude and in response thereto provides to the control unit a second group of tracking pulses concurrently with the displacement direction signal referred to hereinbefore. In response to a tracking pulse and a concurrently provided direction signal, the indicated displacement is changed by a smallest resolvable increment.

6 Claims, 6 Drawing Figures

POSITION-INDICATING SYSTEM

BACKGROUND OF THE INVENTION

1. Field of Invention

This invention relates to apparatus for indicating the displacement between two relatively movable members of a data element and more particularly to apparatus which accurately indicates the displacement when there is relative movement between the members.

2. Description of the Prior Art

To provide an accurate indication of the angular position of a shaft, for example, a control system typically includes a data element such as an Inductosyn transducer, which has a rotatable member connected to the shaft.

The Inductosyn transducer is responsive to displacement signals representative of an indicated angular displacement between relatively rotatable members of the Inductosyn transducer. The Inductosyn transducer provides an error signal indicative of the shaft being angularly displaced to cause a difference between the indicated and actual relative angular displacements. Transducers of the type described hereinbefore are disclosed in U.S. Pat. Nos. 2,799,835 and 2,900,612.

In a typical control system which includes the Inductosyn transducer, a control unit provides the displacement signals.

In response to a tracking pulse provided to the control unit, the displacement signals are changed, the change being representative of the smallest resolvable increment of indicated angular displacement. The U.S. Pat. No. 3,673,395, assigned to the assignee of the instant application, discloses the control unit referred to hereinbefore.

In the typical control system, the error signal is provided to a tracking pulse generator. In response to the error signal, the tracking pulse generator provides tracking pulses which cause the displacement signals to change, thereby reducing the error signal.

Heretofore, most indicating systems were characterized by an angular velocity of the shaft causing a difference between the indicated displacement and the actual displacement because an error signal must be provided to cause a change in the displacement signals. In systems where the error signal is reduced to a null while the shaft is rotated, there is a tendency towards instability which causes unwanted oscillations of the indicated position.

SUMMARY OF THE INVENTION

An object of the present invention is to provide apparatus for indicating the displacement between two relatively movable members of a data element.

Another object of the present invention is to provide a stable system for indicating the displacement between two relatively movable members while there is relative movement between the members.

According to one aspect of the present invention, a data element provides an error signal having a positive sign or a negative sign associated therewith in response to displacement signals representative of indicated displacements which are respectively greater than and lesser than the actual displacement between two relatively movable members of the data element, the amplitude of said error signal being representative of the difference between the actual and indicated displacements; during a cycle of operation, said displacement signals are changed by an amount representative of a known increment of displacement in response to said error signal and by an amount representative of a computed velocity which substantially equals the integral of a digitally modified difference between the indicated and the actual displacements.

According to another aspect of the present invention, said digital modification is the changing of a signal representation of the computed velocity in response to the sign associated with the error signal being unchanged for a predetermined time.

The indicating system may include apparatus for providing an override change of the indicated displacement in response to the amplitude of the error signal being greater than a predetermined amplitude.

Indicating systems constructed in accordance with the present invention have a short settling time, are stable and provide an accurate indication of the actual displacement between two relatively movable members of a data element.

Other objects, features and advantages of the present invention will become more apparent in the light of the following detailed description of a preferred embodiment thereof as illustrated in the accompanying drawing.

DESCRIPTION OF THE PREFERRED EMBODIMENT

The present invention is a position-indicating system predicated upon a data element being provided with displacement signals representative of an indicated displacement between relatively movable of the data element. In response to the displacement signals, the data element provides an error signal representative of the difference between the indicated and actual displacements between the members.

The displacement signals are changed in response to the error signal and a signal representation of a computed velocity which substantially equals the integral of a digitally modified difference between the indicated and the actual displacement. A signal representation of the computed velocity is provided by a velocity counter which is described hereinafter.

The change of the displacement signals in response to the signal representation of the computed velocity causes the error signal to be maintained at a null when the computed velocity equals the actual relative velocity. A reduction of the error signal is caused by the change of the displacement signals in response to the error signal.

According to the present invention, by changing the displacement signals in response to the signal representation of the computed velocity and the error signal, the position indicating system is stable and has a short settling time whereby the indicated and actual displacements are substantially equal.

Figure 1:
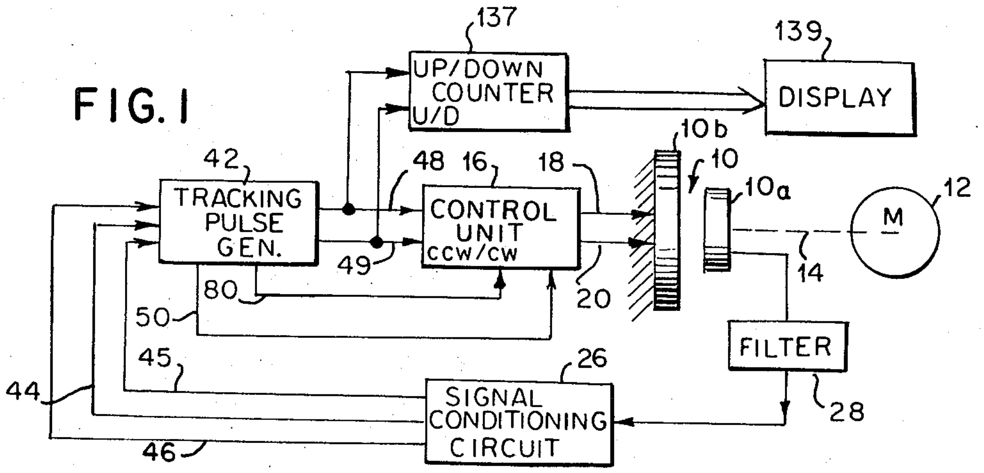
FIG. 1 is a block diagram of the preferred embodiment of the present invention.

Referring now to FIG. 1, an Inductosyn transducer 10, of the type described hereinbefore, has a rotor 10*a* which is relatively rotatable with respect to a fixedly mounted stator 10*b*. The rotor 10*a* is coupled to a motor 12 via a shaft 14 thereof whereby a rotation of the shaft 14 causes a substantially identical rotation of the rotor 10*a*.

AC displacement signals representative of an indicated angular displacement between the rotor 10*a* and the stator 10*b* are provided to the transducer 10 from a control unit 16 (of the type referred to hereinbefore) through signal lines 18, 20. In accordance with the '612 patent, fundamental frequency components of the signals on the lines 18, 20 have amplitudes respectively proportional to the sine and cosine of the angular displacement.

The transducer 10 provides an AC error signal comprised of a fundamental component which has an rms amplitude representative of the difference between the indicated and the actual angular displacements.

In response to the actual angular displacement being greater than the indicated angular displacement, the fundamental component of the error signal is of a known phase (referred to as a positive error signal hereinafter). Correspondingly, in response to the actual angular displacement being less than the indicated angular displacement, the phase of the fundamental component of the error signal is substantially opposite from the known phase (referred to as a negative error signal hereinafter).

Figure 2:
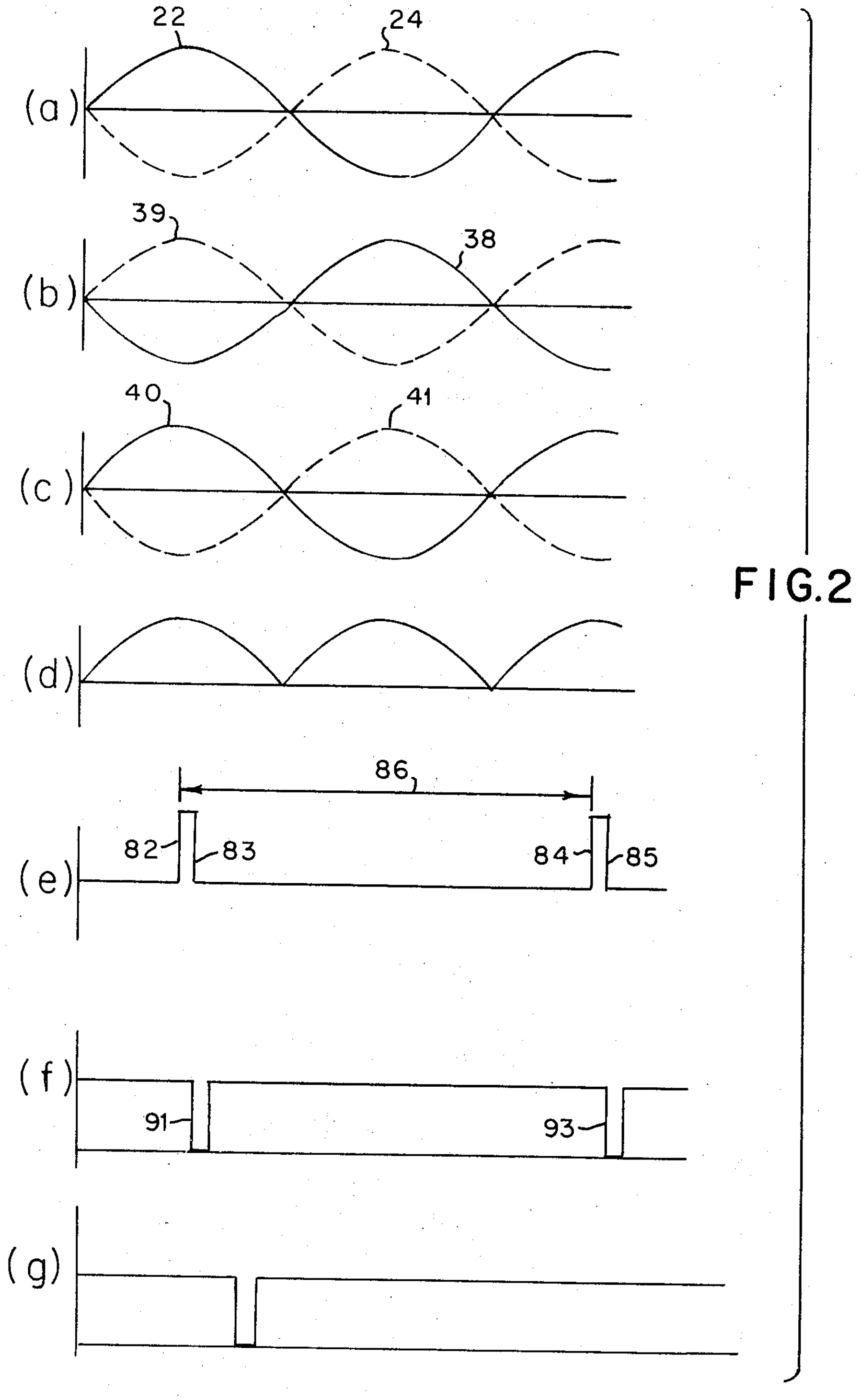
FIG. 2 is an illustration of waveforms of different signals, all on the same time base, in the embodiment of FIG. 1 throughout a cycle of operation.

Referring now to FIG. 2, illustration (a) includes waveforms 22, 24 which are respectively representative of the fundamental components of the positive and the negative error signals.

Figure 3:
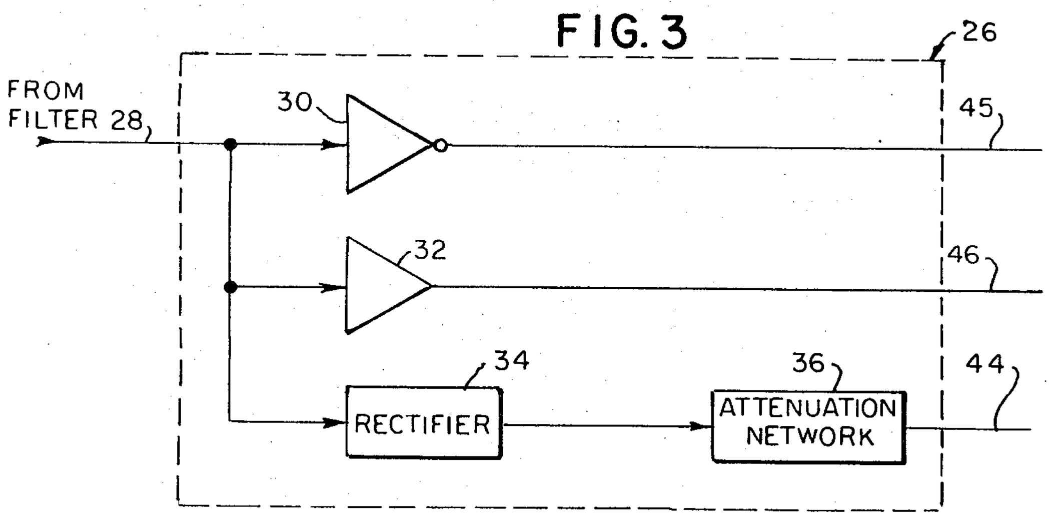
PRIOR ART FIG. 3
FIG. 3 is a schematic block diagram of the signal conditioner circuit which is included in the embodiment of FIG. 1.

Referring to FIGS. 1 and 3, the output of the transducer 10 is connected to a signal conditioning circuit 26 through a low pass filter 28. The filter 28, which may be of any suitable well known type, provides the fundamental component of the error signal.

Within the circuit 26, the output of the filter 28 is provided to the inputs of an inverting amplifier circuit 30, a non-inverting amplifier circuit 32, and a rectifier 34.

The output of the inverting amplifier 30 provides an inverted error voltage of opposite phase from the fundamental component of the error signal. The output of the non-inverting amplifier circuit 32 provides a non-inverted error voltage of the same phase as the fundamental component of the error signal and having the same amplitude as the inverted error voltage. The rectifier 34 provides a signal having a waveform comprised of positive half cycles of a sinusoid of the same peak amplitude as the fundamental component of the error signal (known as full-wave rectification).

The output of the rectifier 34 is connected to an attenuation network 36 which provides a voltage (referred to as an override voltage hereinafter) having a peak value of one-sixtieth of the peak value of the error voltages. In alternative embodiments, the override voltage may be of any desired value.

Referring to FIG. 2, illustration (b) includes waveforms 38, 39 which are representative of the inverted error voltages respectively provided in response to the positive and the negative error signals (waveforms 22, 24 of illustration (a)). Correspondingly, illustration (c) includes waveforms 40, 41 which are representative of the non-inverted error voltage respectively provided in response to the positive and negative error signals. Illustration (d) is of a waveform representative of the override voltage.

The override voltage and the inverted and non-inverted error voltages are provided by the circuit 26 to a tracking pulse generator 42 through signal lines 44–46, respectively.

In response to the override voltages and the error voltages, the generator 42 provides tracking pulses concurrently with a direction signal to the control unit 26 through signal lines 48, 49, respectively. Additionally, the generator 42 provides a sync pulse to the control unit 16 through a signal line 50 whereby the control unit 16 is synchronized to the generator 42 as explained hereinafter.

The generator 42 provides a single tracking pulse in response to an error voltage being greater than a threshold voltage. Additionally, the generator 42 provides a group of tracking pulses in proportion to the integral of a digitally modified difference between the indicated and the actual angular displacements. The modification causes the signal representative of the computed velocity to change in response to an error voltage having a pair of successive positive peaks greater than the threshold voltage.

The absence of a tracking pulse is characterized by approximately three volts (referred to as ONE hereinafter), being provided on the line 48; a positive voltage of less than one-half volt (referred to as ZERO hereinafter) characterizes the presence of a tracking pulse. The absence and presence of a sync pulse is correspondingly characterized. As known to those skilled in the art, ONE and ZERO are collectively referred to as logic signals.

In response to a tracking pulse and a direction signal, the displacement signals are changed, the change being representative of a smallest resolvable increment of the indicated angular displacement between the rotor 10*a* and the stator 10*b*. The change increases or decreases the value of the indicated angular displacement in response to the concurrent direction signal being respectively ZERO and ONE.

Figure 4:
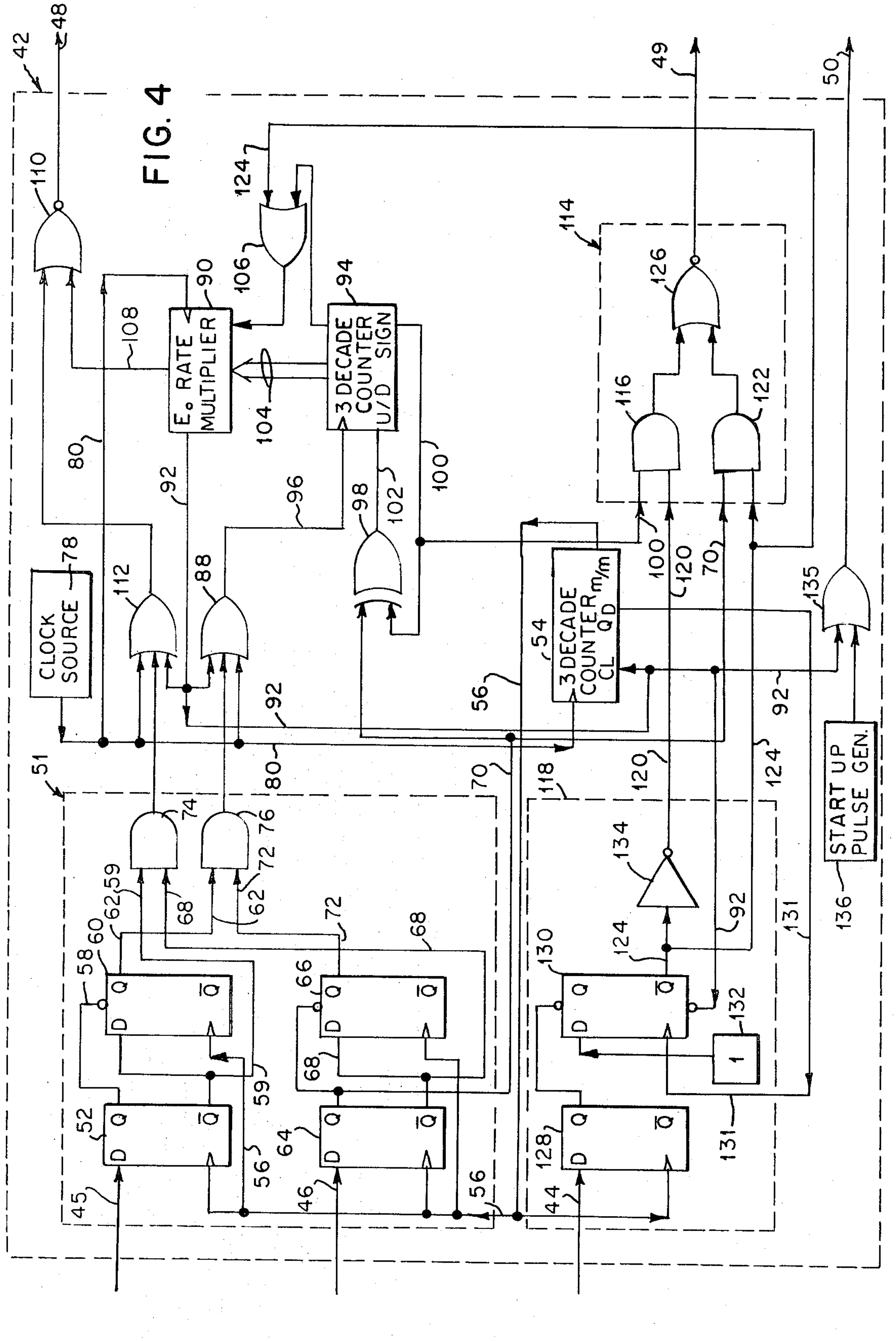
FIG. 4 is a schematic block diagram of a tracking pulse generator which is included in the embodiment of FIG. 1.

Referring now to FIG. 4, the generator 42 includes an error circuit 51 which provides logic signals indicative of one of the error voltages (illustrations (b) and (c), FIG. 2) respectively having one and two successive positive peaks greater than approximately 1.5 volts (referred to as a threshold voltage hereinafter). Additionally, the circuit 51 provides a logic signal indicative of the positive error signal causing the non-inverted error voltage to have a positive peak greater than the threshold voltage.

As explained hereinafter, outputs of the circuit 51 are utilized for providing a single tracking pulse and a displacement signal when the positive peak of an error voltage is greater than the threshold voltage. The outputs additionally provide a digital modification whereby a signal representation of a computed angular velocity of the rotor 10*a* relative to the stator 10*b* is changed when an error voltage has two successive positive peaks greater than the threshold voltage.

Within the circuit 51, a flip-flop 52 has a D input connected to the line 45. Additionally, a clock input of the flip-flop 52 is connected to an output of a three-decade counter 54 through a signal line 56. The output of the flip-flop 52 may change only when there is provided to the clock input thereof a transition from ZERO to ONE (referred to as strobing).

In response to strobing the flip-flop 52 and concurrently providing a voltage more positive than the threshold voltage on the line 45, ONE and ZERO are respectively provided at a direct output and a complementary output of the flip-flop 52; providing less than the threshold voltage during the strobing causes the provision of ZERO and ONE, respectively at the direct and the complementary outputs. D flip-flops of the type described hereinbefore are well known in the art.

It should be understood (from illustrations (a), (b) and (c), FIG. 2) that when a negative error signal is provided, the flip-flop 52 is strobed concurrently with the provision of the positive peak of the inverted error voltage. Accordingly, the flip-flop 52 provides ONE at the direct output thereof in response to a negative error signal causing the inverted error voltage to have a positive peak greater than the threshold voltage.

The complementary output of the flip-flop 52 is connected to a D flip-flop 60 (similar to the flip-flop 52 described hereinbefore) at a D input thereof through a signal line 59. Similar to the flip-flop 52, a clock input of the flip-flop 60 is connected to the line 56. Additionally, the flip-flop 60 has a preset input connected to the direct output of the flip-flop 52 through a signal line 58. In response to ZERO being provided on the line 58, ONE is provided at a direct output of the flip-flop 60; the direct output remains unchanged in response to ONE being provided on the line 58.

As explained hereinafter, the flip-flop 60 provides a logic signal indicative of a negative error signal causing the inverted error voltage to have two successive positive peaks greater than the threshold voltage.

In response to the flip-flop 52 being strobed when less than the threshold voltages is being provided on line 45 (inverted error voltage), ZERO is provided on the line 58 whereby the flip-flop 60 provides ONE on the line 62. Thereafter, in response to the flip-flop 52 being strobed when the inverted error voltage has a first positive peak greater than the threshold voltage, ONE and ZERO are respectively provided on the lines 58, 59. However, the output of the flip-flop 60 remains unchanged in response to ONE provided to the preset input thereof, whereby ONE remains on the line 62.

When ZERO is provided on the line 59 (the D input of flip-flop 62) and the flip-flops 52, 60 are strobed when the inverted error voltage has a second positive peak greater than the threshold voltage, ZERO is provided on the line 62. Accordingly, the flip-flops 52, 60 are in a circuit configuration which provides ZERO in response to a negative error signal causing the inverted error voltage to have two successive positive peaks greater than the threshold voltage.

In a circuit configuration similar to that of the flip-flops 52, 60 described hereinbefore, a flip-flop 64 (similar to the flip-flop 52) has a D input and a clock input respectively connected to the lines 46, 56. Accordingly, the non-inverted error voltage is provided to the flip-flop 64 which is strobed simultaneously with the flip-flops 52, 60.

It should be understood (from illustrations (a), (b), and (c), FIG. 2) that when a positive error signal is provided, the flip-flop 64 is strobed concurrently with the provision of the positive peak of the non-inverted error voltage.

A direct output and a complementary output of the flip-flop 64 are respectively connected to a flip-flop 66 (similar to the flip-flop 60 described hereinbefore) at a D input thereof through a signal line 68 and at a preset input thereof through a signal line 70.

In accordance with the explanation given hereinbefore, the flip-flop 66 provides ZERO at the direct output thereof in response to a positive error signal causing the non-inverted error voltage to have two successive positive peaks greater than the threshold voltage. Additionally, the flip-flop 64 provides ONE at the direct output thereof in response to a positive error signal causing the non-inverted error voltage to have a positive peak greater than the threshold voltage. Accordingly, the flip-flop 64 provides on the line 70 an output of the circuit 51.

The complementary outputs of the flip-flops 52, 64 are connected to an AND gate 74 at respective inputs thereof through the lines 59, 68.

An AND gate is a well known circuit for providing ONE in response to ONE's being concurrently provided to the inputs thereof; ZERO is provided in response to ZERO being provided to an input. Accordingly, in response to ZERO being concurrently provided on the line 59 or on the line 68, the AND gate 74 provides ZERO at the output thereof. Therefore, the AND gate 74 provides ZERO in response to one of the error voltages having a positive peak greater than the threshold voltage whereby an output of the circuit 51 is provided.

The true outputs of the flip-flops 60, 66 are connected to an AND gate 76 at respective inputs thereof through signal lines 62, 72. Accordingly, the AND gate 76 provides ZERO in response to one of the error voltages having two successive positive peaks greater than the threshold voltage whereby an output of the circuit 51 is provided.

To strobe the flip-flops 52, 60, 64, 66, the counter 54 has a clock input connected to a clock pulse source 78 through a signal line 80. In this embodiment, the clock source 78 provides logic signal pulses (comprised of transitions between ONE and ZERO) at the rate of 10 megahertz, but in alternative embodiments any desired pulse rate may be provided.

In response to the clock pulses, the counter 54 provides on the line 56 data strobe pulses at the rate of ten thousand pulses per second. The interval between a pair of successive strobe pulses is referred to as a cycle of operation. The presence of a strobe pulse is characterized by ONE being provided on the line 56, the absence thereof being characterized by a ZERO being provided. It should be understood that each strobe pulse causes a strobing of the flip-flops 52, 60, 64, 66.

The counter 54 may be comprised of model SN 74190 integrated circuit counters manufactured by Texas Instruments, Inc. or any other suitable counters.

Because of the synchronization of the control unit 16 referred to hereinbefore the positive error signal causes the positive peak of the non-inverted error voltage simultaneously with a strobe pulse. Correspondingly, the negative error signal causes the provision of the positive peak of the inverted error voltage simultaneously with a strobe pulse.

Referring to FIG. 2, illustration (e) is of a waveform representative of a pair of successive strobe pulses having respective leading edges 82, 84 and respective trailing edges 83, 85. A displacement line 86 has a length equal to the displacement between the edges 82, 84 (representative of clock transitions). The line 86 is therefore representative of a cycle of operation.

The output of the AND gate 76 is connected to an OR gate 88 at one of three inputs thereof whereby the second output of the circuit 51 is provided to the OR gate 88. The other two inputs of the OR gate 88 are respectively connected to the clock source 78 through the line 80 and a synchronous rate multiplier 90 at an enable output thereof through a signal line 92.

An OR gate is a well known circuit for providing ONE in response to ONE being provided to any input thereof; ZERO is provided in response to ZERO's being concurrently provided to all of the inputs. Accordingly, clock pulses are provided at the output of the OR gate 88 in response to ZERO's being concurrently provided by the AND gate 76 and on the line 92.

The rate multiplier 90 has a clock input connected to the clock source 78 through the line 80. In a first aspect of its operation, the rate multiplier 90 provides enable output pulses on the line 92 at the rate of 10,000 pulses per second. Since the clock source 78 provides pulses at the 10 megahertz rate, each enable output pulse has a duration of 1/1000 of a cycle of operation. The presence and absence of an enable output pulse are characterized by ZERO and ONE respectively provided on the line 92. The rate multiplier 90 may be comprised of model SN 74167 integrated circuits manufactured by Texas Instruments, Inc. or any other suitable circuits.

The enable output is additionally connected to a clear input of the counter 54 through the line 92. In response to an enable output pulse, the counter 54 is cleared. After the counter 54 is cleared, a strobe pulse is provided in response to 999 clock pulses being provided on the line 80. Accordingly, the operation of the counter 54 is synchronized with the rate multiplier 90 whereby an enable output pulse is provided during the second 1/1000 of a cycle of operation.

Referring to FIG. 2, illustration (f) is a waveform representative of successive enable output pulses having leading edges 91, 93 which are respectively concurrent with the edges 83, 85 (illustration (e)).

It should be understood that because the enable output pulses are provided at the rate of 10,000 per second, a single clock pulse is provided during the second 1/1000 of a cycle of operation. Accordingly, the OR gate 88 (having an input connected to the line 92) provides the single clock pulse therethrough in response to ZERO being provided by the AND gate 76 (one of the error voltages having two successive positive peaks greater than the threshold voltage) during a cycle of operation.

The output of the OR gate 88 is connected to a three-decade velocity counter 94 at a clock input thereof through a signal line 96. As explained hereinafter, the counter 94 provides a logic signal representation of the cumulative difference between the number of times that a positive error signal causes the non-inverted error voltage to have two successive positive peaks greater than the threshold voltage and the number of times that a negative error signal causes the inverted error voltage to have two successive positive peaks greater than the threshold voltage. The cumulative difference equals the integral of the digitally modified difference (described hereinbefore) between the indicated and the actual angular displacements and is referred to hereinafter as the computed angular velocity of the shaft 14 relative to the stator **10*b* (FIG. 1**).

The counter 94 provides at a sign output thereof a logic signal associated with the sign of the computed angular velocity. ONE and ZERO are representative of the computed velocity respectively having a positive and a negative sign. The sign output is changed from ONE to ZERO and vice versa in response to the velocity signal representation being respectively changed to represent positive and negative increases in the computed velocity when the computed velocity is zero.

The sign output of the counter 94 is provided to an EXCLUSIVE-OR gate 98 at one of two inputs thereof through a signal line 100, the other input being connected to the circuit 51 through the line 70.

An EXCLUSIVE-OR gate is a well known circuit for providing ONE in response to ONE and ZERO being respectively provided to two inputs thereof; ZERO is provided in response to either a pair of ONE's or a pair of ZERO's being respectively provided to the inputs.

The output of the EXCLUSIVE-OR gate 98 is connected to the counter 94 at an up/down input thereof through a signal line 102. In response to ZERO being provided on the line 102, a clock pulse provided through the OR gate 88 causes the counter 94 to provide a signal representation of the computed velocity increased in absolute value by a least significant increment. Correspondingly, in response to ONE being provided on the line 102 and a clock pulse being concurrently provided through the OR gate 88, the counter 94 provides a representation of the computed velocity which is decreased in absolute by the least significant increment.

According to the described embodiment, the signal representation of the computed velocity is changed only when ZERO is provided by the AND gate 76 to the OR gate 88 (an error voltage having two successive positive peaks greater than the threshold voltage).

The counter 94 is connected to the rate multiplier 90 through a plurality of signal lines 104. Additionally, an OR gate 106 has one of two inputs thereof connected to the counter 94 and an output connected to the rate multiplier 90. The output of the OR gate 106 and the signals on the lines 104 comprise (when the counter 94 provides a signal through the OR gate 106) the signal representation of the absolute value of the computed velocity.

As explained hereinafter, in response to the override voltage having a positive peak greater than the threshold voltage, the OR gate 106 provides ONE which is referred to hereinafter as an override change.

In response to the signal representation of the absolute value of the computed velocity and in accordance with a second aspect of the operation of the rate multiplier 90, provided thereby during a cycle of operation is a first group of tracking pulses on a signal line 108. The number of pulses in the first group is proportional to the computed velocity. The pulses in the first group are successively provided with substantially equal time between successive pulses. It should be understood that ZERO is provided on the line 108 when the rate multiplier 90 does not provide a tracking pulse.

The rate multiplier 90 is connected to a NAND gate 110 at one of two inputs thereof through the line 108 whereby the tracking pulses are provided to the NAND gate 110. The other input of the NAND gate 110 is connected to the output of an OR gate 112.

A NAND gate is a well known circuit for providing ZERO in response to ONE's being concurrently provided to the input thereof; ZERO being provided at an input causes the provision of ONE at the output.

The OR gate 112 has three inputs, one of which is connected to the line 92. Accordingly, the OR gate 112 provides ONE at the output thereof in the absence of the enable output pulse whereby the NAND gate 110 is conditioned to provide the first group of tracking pulses during all but the second 1/1000 of a cycle of operation.

The output of the NAND gate 110 is connected to the control unit 16 through the line 48 thereby providing tracking pulses for changing the displacement signals as described hereinbefore.

Because of the second aspect of the operation of the rate multiplier 90, the second group causes the indicated angular displacement to change substantially uniformly during a cycle of operation.

When the enable output pulse is provided, a single tracking pulse is provided during a cycle of operation in response to the AND gate 74 providing ZERO (one of the error voltages having a positive peak greater than the threshold voltage). According to the described embodiment, the single tracking pulse (and a direction signal provided concurrently therewith) causes a reduction of the error signal which caused the single tracking pulse, thereby causing the position indication system to be accurate to within the smallest resolvable increment of indicated angular displacement.

To provide the single tracking pulse, the output of the AND gate 74 is connected to an input of the OR gate 112. Additionally, an input of the OR gate 112 is connected to the clock source 78 through the line 80. Accordingly, in response to ZERO being concurrently provided on the line 92 and by the output of the AND gate 74, a clock pulse is provided through the gates 110, 112 to the control unit 16.

Concurrently with the provision of the first group of tracking pulses, a velocity direction signal associated therewith is provided by a direction circuit 114. Correspondingly, concurrent with the provision of the single tracking pulse, a displacement direction signal associated therewith is provided by the circuit 114. The output of the circuit 114 is connected to the line 49 whereby the direction signals are provided to the circuit 16.

The circuit 114 includes an AND gate 116 having two inputs respectively connected to an override circuit 118 through a signal line 120 and the sign output of the counter 94 through the line 100. As explained hereinafter, in the concurrent absence of the enable pulse and an override voltage having a peak greater than the threshold voltage, ONE is provided on the line 120. In response to ONE being provided on the line 120, ONE or ZERO are provided at the output of the AND gate 116 when ONE and ZERO are respectively provided at the output of the counter 94.

The circuit 114 further includes an AND gate 122 having two inputs respectively connected to the override circuit 118 through the signal line 124 and the circuit 51 through the line 70.

As explained hereinafter, the override circuit 118 provides on the line 124 the logical inverse of the logic signal provided on the line 120. As shown to those skilled in the art, in providing a logical inverse, ONE is provided in response to ZERO and vice versa. Additionally, ZERO is provided on the line 124 in the concurrent absence of the enable pulse and an override voltage having a peak greater than the threshold voltage. Accordingly, when the first group of tracking pulses is provided by the rate multiplier 90 (in the absence of an override voltage having a peak greater than the threshold voltage) ZERO is provided by the AND gate 122.

The outputs of the AND gates 116, 122 are respectively connected to two inputs of a NOR gate 126. A NOR gate is a well known circuit for providing ZERO in response to ONE being provided to an input thereof; in response to ZERO's being concurrently provided to the inputs, the NOR gate provides ONE. Accordingly, in response to ONE and ZERO being respectively provided on the lines 120, 124, the NOR gate 126 provides the logical inverse of the logic signal provided at the sign output of the counter 94 whereby the velocity direction signal is provided.

When the single tracking pulse is provided, the enable output pulse causes the override circuit 118 to provide ZERO and ONE, respectively, on the lines 120, 124. In response to the enable output pulse, ZERO is provided at the output of the AND gate 116 whereby the circuit 114 is conditioned to provide the displacement direction signal.

The displacement direction signal is ZERO (provided at the output of the NOR gate 126 concurrently with the provision of the single tracking pulse through the gates 110, 112) in response to ONE being provided on the line 70 (caused by a positive error signal); in response to ZERO being provided on the line 70, ONE is provided by the NOR gate 126.

Therefore, in response to the output of the AND gate 74 being ZERO (caused by a negative error signal), the single tracking pulse is provided and ONE is provided by the NOR gate 126 as the direction signal associated therewith.

It should be understood that in response to the AND gate 74 providing ONE (concurrently with the provision of the enable output pulse), the single tracking pulse is not provided whereby ONE provided by the NOR gate 126 does not cause a change of the displacement signals.

In this embodiment, in response to a direction signal being ZERO concurrently with the provision of a tracking pulse, the control unit 16 changes the displacement signals whereby the value of the indicated displacement is increased by the smallest resolvable increment; a direction signal being ONE concurrently with the provision of a tracking pulse causes a corresponding decrease in the value of the indicated displacement.

In accordance with the explanation given hereinbefore, in response to the computed velocity equalling the actual velocity (of the shaft 14 relative to the stator **10*b***) when the error signal is substantially at a null, the first group of tracking pulses and the velocity direction signal causes the error signal to remain at a null.

In response to the computed velocity not equalling the actual velocity, the error signal cannot remain at a null because the difference of the velocities causes an increasing difference between the indicated and actual displacements. The increasing difference causes an increasing error signal whereby the computed velocity changes as described hereinbefore. The rate of change of the computed velocity is maintained at one least significant increment per cycle of operation while an error signal persists.

A second group of tracking pulses is provided in response to the override circuit 118 providing ONE to the input of the OR gate through the line 124. In response thereto, the OR gate 106 provides ONE to the rate multiplier 90. When ZERO is provided by the counter 94 to the OR gate 106, ONE provided therethrough by the override circuit 118 causes an override change in the signal representation provided to the rate multiplier 90.

When the override change is provided, the rate multiplier 90 has provided thereto a signal representation of a value greater than the computed velocity. As explained hereinafter, the override change causes the provision of the second group of tracking pulses.

The override circuit 118 includes a D flip-flop 128 (similar to the flip-flop 52) having a D input and a clock input respectively connected to the lines 44, 56. Therefore, the flip-flop 128 is strobed when there is provided to the D input thereof alternate peaks of the override voltage. Accordingly, ONE is provided at the direct output of the flip-flop 128 in response to a strobing thereof when the peak of the override voltage is greater than the threshold voltage.

The direct output of the flip-flop 128 is connected to a flip-flop 130 (similar to the flip-flop 60) at a preset input thereof. A D input of the flip-flop 130 is connected to a voltage source 132 which provides a voltage of approximately 3 volts (ONE). Additionally, a clock input of the flip-flop 130 is connected to the counter 54 through a signal line 131. During a cycle of operation, the counter 54 provides an override clear pulse to the flip-flop 130.

In response to ZERO being provided at the direct output of the flip-flop 128, ZERO is provided at the complementary output of the flip-flop 130. The complementary output of the flip-flop 130 thereby provides an indication that the override voltage has a peak less than the threshold voltage (when the flip-flop 128 is strobed).

A clear input of the flip-flop 130 is connected to the enable output of the rate multiplier 90 through the signal line 92. In response to ZERO being provided to the clear input, ONE is provided at the complementary output of the flip-flop 130. Accordingly, when the override voltage is less than the threshold voltage (ZERO at the preset input of the flip-flop 130), the complementary output of the flip-flop 130 provides ONE only when the enable pulse is provided, ZERO being provided during the other 999/1000 of the cycle of operation.

The complementary output of the flip-flop 130 is connected to the OR gate 106 through the line 124. Accordingly, an output of the counter 94 is provided through the OR gate 106 as described hereinbefore when ZERO is provided at the complementary output of the flip-flop 130.

In response to an override voltage greater than the threshold voltage (ONE at the preset input of the flip-flop 130), the complementary output of the flip-flop 130 provides ONE after the enable pulse is provided whereby ONE is provided through the OR gate 106 thereby providing the override change.

Referring now to FIG. 2, illustration (g) is of the waveform of an override clear pulse. The override change is terminated in concurrent response to an override clear pulse and the ONE provided by the source 132 which causes the complementary output of the flip-flop 130 to provide ZERO. While the override change is provided, the rate multiplier 90 provides on the order of 100 tracking pulses which comprise the second group of tracking pulses.

The complementary output of the flip-flop 130 is additionally connected to an inverter 134 at the input thereof through the line 124. The output of the inverter 134 is connected to the line 120. The inverter 134 provides a logic signal which is the inverse of the signal provided at the input thereof. Accordingly, concurrent with the provision of the second group of tracking pulses, the displacement direction signal is provided by the circuit 114 (the inverse of the logic signal provided on the line 70).

To provide the sync pulse, the enable output of the rate multiplier 90 is connected to one of two inputs of an OR gate 135. The other input of the OR gate 135 is connected to the output of a start-up pulse generator 136. When the position-indicating system is first started, the start-up generator 136 provides ZERO for a time equal to the time duration of a cycle of operation. In concurrent response to ZERO being provided by the start at generator 136 and an enable output pulse, the sync pulse is provided on the line 50.

Figure 5:
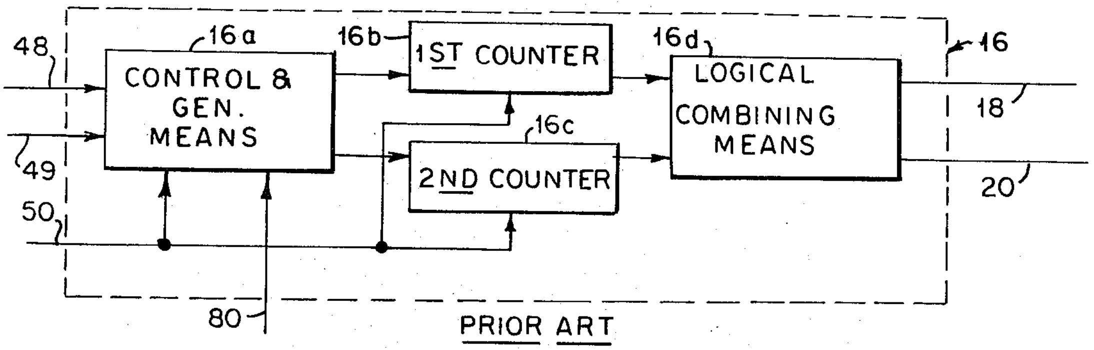
FIG. 5 is a schematic block diagram of the control unit in the embodiment of FIG. 1.

Referring now to FIG. 5, included in the control unit 16 is a portion of the apparatus disclosed in the '395 patent. The control unit 16 includes a control and generator means **16*a* which has inputs connected to the lines 48–50, 80.**

The generator means **16*a* is connected to a first counter 16*b* and a second counter 16*c* which have respective clear inputs connected to the line 50. In response to a sync pulse, the generator means 16*a* and the counters 16*b*, 16*c*** are cleared.

The counters **16*b*, 16*c* are both connected to logical combining means 16*d*** which provides the displacement signals referred to hereinafter.

The clock source 78 (FIG. 4) is connected through the line 80 to the control unit 16 whereby clock pulses are provided thereto.

Referring to FIG. 1, additionally connected to the lines 48, 49 is an up/down counter 137 which provides a logic signal representation of a number of tracking pulses (referred to as a counter indication hereinafter). In response to ZERO being provided on the line 49 concurrently with a tracking pulse being provided on the line 48, the counter indication is changed to be representative of the number of tracking pulses increased by a least significant increment. Correspondingly, in response to ONE being provided on line 48, the counter indication is changed to be representative of the number of tracking pulses decreased by a least significant increment.

Accordingly, the counter indication is representative of the cumulative incremental changes of the displacement signals. Therefore, the counter indication is representative of the indicated angular displacement.

In this embodiment the counter 137 is connected to a visual display 139 which provides a visual indication of the indicated angular displacement.

Thus there has been described in indicating system which indicates the angular displacement between movable members of a transducer.

It should be understood that in alternative embodiments, the invention may provide an indication of linear displacement between relatively movable members of a data element.

Figure 6:
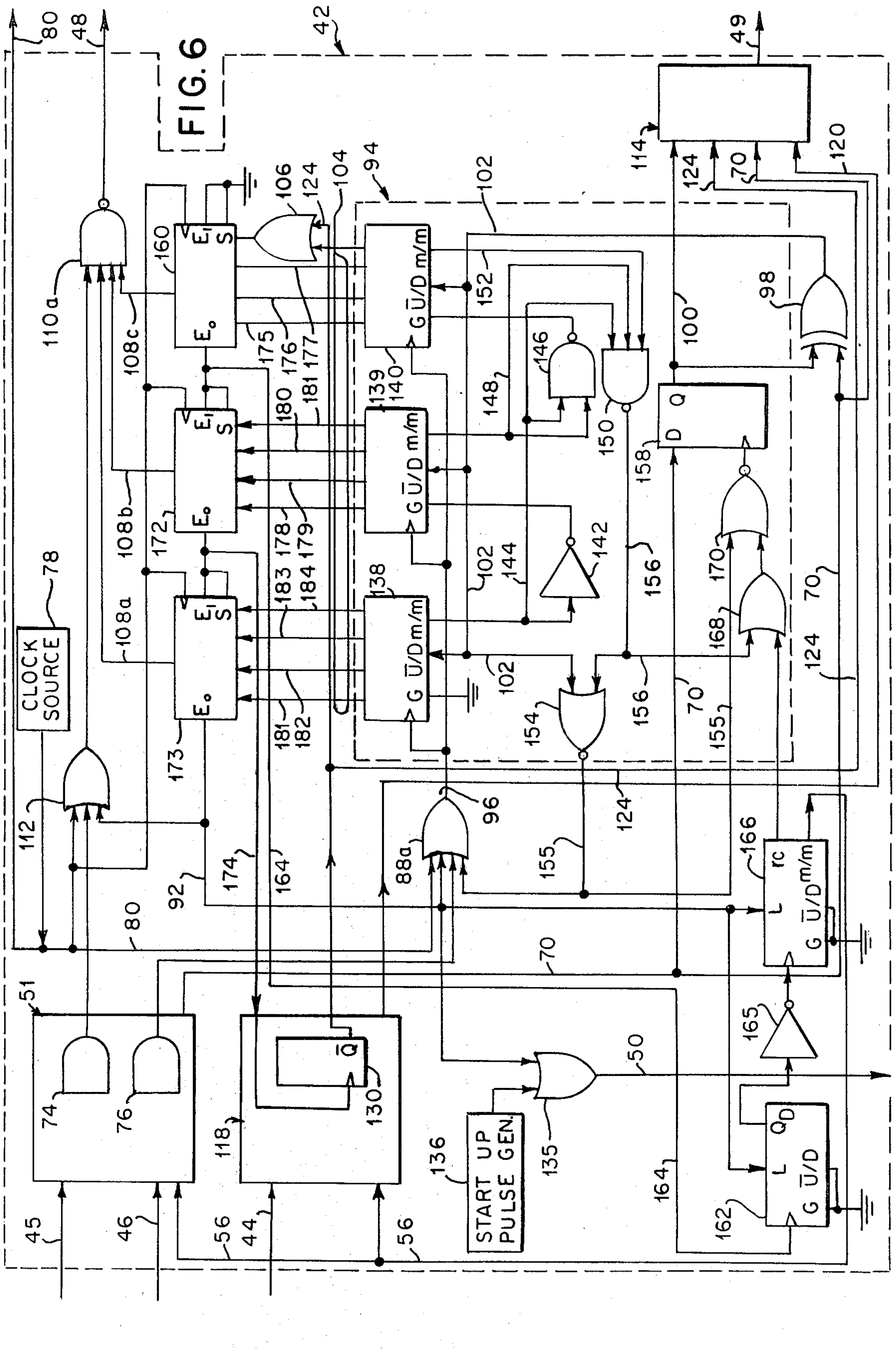
FIG. 6 is a schematic diagram of a prototype of the tracking pulse generator of FIG. 4.

Referring now to FIG. 6, in a prototype of the pulse generator 42, the counter 94 is comprised of decade counters 138–140 which are respectively three of the model SN 74190 decade counters referred to hereinbefore. The counters 138–140 have a $\overline{U}$/D input and a clock input respectively connected to the EXCLUSIVE-OR gate 98 through the line 102 and the output of an OR gate 88*a* through the line 96.

The decade counters 138–140 respectively provide signal representations of a number ranging from zero to nine. Each of the counters 138–140 are conditioned to be incremented and decremented in response to ZERO being provided at the G input thereof.

It should be understood that incrementing and decrementing respectively causes an increase and a decrease of the represented number by a least significant increment, one. The incrementing is in concurrent response to a clock pulse provided to the clock inputs when ZERO is provided at the $\overline{U}$/D inputs; the decrementing is in response to a clock pulse when ONE is provided at the $\overline{U}$/D inputs.

When, for example, the decade counter 138 provides a representation of the number, nine, incrementing causes an overflow whereby a representation of the number, zero, is provided. When the decade counter 138 provides a representation of the number, zero, decrementing causes an underflow whereby a representation of the number, nine, is provided.

As explained hereinafter, the decade counters 138–140 respectively provide signal representations of the units, tens and hundreds digits of a three-digit number associated with the counter 94.

The decade counter 138–140 have *m/m* outputs which respectively provide indications of overflow and underflow conditioning. ONE is provided, for example, at the *m/m* output of the decade counter 138 when a signal representation is provided thereby of the number, nine, concurrently with ZERO being provided to the $\overline{U}$/D input thereof. Accordingly, an indication is provided of the decade counter 138 being conditioned to overflow. Correspondingly, ONE is provided at the *m/m* output of the decade counter 138 when a signal representation is provided thereby of the number, zero, concurrently with ONE being provided at the $\overline{U}$/D input thereof. Accordingly, an indication is provided of the decade counter 138 being conditioned to underflow.

The G input of the decade counter 138 is connected to ground (ZERO) whereby the decade counter 138 is conditioned to be incremented or decremented in response to each clock pulse provided thereto. Therefore, the decade counter 138 provides the signal representations of the units digit of the counter 94.

The *m/m* output of the decade counter 138 is connected to the input of an inverter 142. The output of the inverter 142 is connected to the G input of the decade counter 139 whereby the decade counter 139 is conditioned to be incremented and decremented only when the counter 138 is respectively conditioned to overflow and underflow. Therefore, the decade counter 139 provides the signal representation of the tens digit of the counter 94.

The *m/m* output of the decade counter 139 is connected to one of two inputs of a NAND gate 146 through a signal line 148, the other input being connected to the counter 138 through the line 144. The output of the NAND gate 146 is connected to a G input of the counter 140. Accordingly, the counter 140 is conditioned to be incremented and decremented in concurrent response to the decade counters 138, 139 being concurrently conditioned to respectively overflow and underflow. Therefore, the decade counter 140 provides a signal representation of the hundreds digit of the counter 94.

The *m/m* outputs of the counters 138–140 are respectively connected to inputs of a NAND gate 150 through signal lines 144, 148 and a signal line 152, respectively. Therefore, in response to ONE's being concurrently provided by the *m/m* outputs of the counters 138–140, the NAND gate 150 provides ZERO.

Hence, the provision of zero by the NAND gate 150 is indicative of the decade counters 138–140 being concurrently conditioned to overflow or underflow. It should be understood that the concurrent overflow or underflow of the decade counters 138–140 defines an overflow and an underflow condition of the counter 94, respectively.

The output of the NAND gate 150 is connected to one of two inputs of a NOR gate 154 through a signal line 156. The other input of the NOR gate 154 is connected to the output of the EXCLUSIVE-OR gate 98 through the line 102. Therefore, in response to the counter 94 being conditioned to overflow, ONE is provided at the output of the NOR gate 154.

The output of the NOR gate 154 is connected to an input of the OR gate 88*a* through a signal line 155. The other inputs of the OR gate 88*a* are respectively connected to the signal lines 80, 92 and the output of the AND gate 76. Therefore, a clock pulse provided by the source 78 cannot be provided at the output of the OR gate 88*a* in response to ONE being provided at the output of the NOR gate 154 thereby preventing an overflow of the counter 94. It should be understood that the OR gate 88*a* (having four inputs) corresponds to the OR gate 88 of FIG. 4 (having three inputs). The input of the OR gate 88*a*, not present on the OR gate 88, is used for preventing an overflow of the counter 94.

As explained hereinafter, an underflow of the counter 94 is prevented by changing the output of the EXCLUSIVE-OR gate 98 from ZERO to ONE in response to the decade counters 138–140 concurrently providing respective signal representations of the number, zero.

The EXCLUSIVE-OR gate 98 has an input connected to a direct output of a flip-flop 158 (similar to the flip-flop 52 described hereinbefore). As explained hereinafter, the flip-flop 158 is strobed to cause the output of the EXCLUSIVE-OR gate 98 to change to prevent an underflow of the counter 94. It should be understood that when the counter 94 is conditioned for an underflow, the sign of the computed velocity changes. Because the true output of the flip-flop 158 is changed concurrently with preventing an underflow, provided thereby is a representation of the sign of the computed velocity.

In providing for a strobe of the flip-flop 158, an enable output of a model SN 74167 synchronous rate multiplier circuit 160 (the type referred to hereinbefore) is connected to a clock input of a decade counter 162 through a signal line 164. The circuit 160 has a clock input connected to the clock source 78 through the signal line 80.

In response to every tenth clock pulse, the enable output of the circuit 160 provides ZERO thereby providing counter pulses to the decade counter 162. The G and $\overline{U}$/D inputs of the counter 162 are both connected to ground whereby each of the counter pulses causes an incrementing of the decade counter 162.

A $Q_d$ output of the counter 162 is connected to the input of an inverter 165. The $Q_d$ output of the counter 162 provides ONE in response to the counter 162 providing a signal representation of the number, eight or nine.

The output of the inverter 165 is connected to the clock input of a decade counter 166 (model SN 74190) at a clock input thereof. In a manner similar to the decade counter 162, the counter 166 has G and $\overline{U}$/D inputs thereof both connected to ground.

In response to the $Q_d$ output of the counter 162 providing ten transitions from zero to one, an rc output of the counter 166 provides a pulse whereby ONE is provided from the tenth time that the $Q_d$ output becomes ONE until ZERO is provided to respective load inputs of the counters 162, 166 through the line 92. As explained hereinafter, when the counter 94 is conditioned to underflow, the rc pulse causes the flip-flop 158 to provide a logic signal which causes the EXCLUSIVE-OR gate 98 to provide ZERO thereby conditioning the counter 94 to be incremented whereby an underflow is prevented.

The rc output of the counter 166 is connected to one of two inputs of an OR gate 168, the other input being connected to the output of the NAND gate 150 through the line 156. Therefore, in response to the counter 94 providing a signal representation of ZERO and the rc pulse being provided by the counter 166, ONE is provided at the output of the OR gate 168.

The output of the OR gate 168 is connected to one of two inputs of a NOR gate 170, the other input being connected to the output of the NOR gate 154 through the signal line 155. The output of the NOR gate 170 is connected to the flip-flop 158 at a clock input thereof.

Accordingly, in response to the counter 94 being conditioned to underflow, ONE is provided by the EXCLUSIVE-OR gate 98 to the input of the NOR gate 154 whereby ZERO is provided to the NOR gate 170. Since ZERO is provided by the NAND gate 150, the rc pulse is fed through the gates 168, 170 to the clock input of the flip-flop 158.

The flip-flop 158 has a D input connected to the line 70. Since the EXCLUSIVE-OR gate 98 also has an input connected to the line 70, in response to the rc pulse being provided through the gates 168, 170, either a pair of ONE's or a pair of ZERO's are respectively provided to the EXCLUSIVE-OR gate 98 whereby ZERO is provided at the output thereof. It should be understood that the flip-flop 158 is strobed prior to ZERO being provided on the line 92, thereby preventing the underflow of the counter 94.

It should be understood that the counter 54 (FIG. 4) is comprised of the circuit 160 and the decade counter 162, 166. The *m/m* output of the counter 166 provides on the line 56 the strobe pulses described hereinbefore.

The rate multiplier circuit 92 (FIG. 4) is comprised of three model SN74167 synchronous rate multiplier circuits 160, 172, 173. The circuit 160 has inputs connected to the decade counter 140 through signal lines 175–177, respectively. Additionally, an input of the circuit 160 is connected to the output of the OR gate 106. Accordingly, a signal representation of the hundreds digit of the counter 94 is provided to the circuit 160.

The circuit 172 has inputs connected to outputs of the decade counter 139 through signal lines 178–181 whereby a signal representation of the tens digit of the counter 94 is provided to the circuit 172.

Similarly, the circuit 173 has inputs connected to the outputs of the decade counter 138 through signal lines 181–184 whereby signal representation of the units digit of the counter 94 is provided to the circuit 173.

The circuit 160 has an $E_1$ and an S input both connected to ground whereby ZERO is provided thereto. Additionally, the clock inputs of the circuits 160, 172, 173 are all connected to the clock source 78 through the line 80.

The circuits 160, 172, 173 are serially connected whereby the enable output of the circuit 160 is connected to the $E_1$ and S inputs of the circuit 172 and the enable output of the circuit 172 is connected to the $E_1$ and the S inputs of the circuit 173. Respective pulse outputs of the circuits 160, 172, 173 are connected to inputs of a NAND gate 110*a* whereby tracking pulses are provided thereto. The circuits 160, 172, 173 provide the tracking pulses through the NAND gate 110*a*. Accordingly, the circuits 160, 172, 173 and the NAND gate 110*a* respectively correspond to the rate multiplier 90 and to the NAND gate 110 of FIG. 4.

Thus there has been described the prototype of the pulse generator 42.

A feature of the prototype is that the override change is terminated by the circuit 172 providing pulses to the clock input of the flip-flop 130 through a signal line 174. Enable output pulses provided by the circuit 172 causes the second group to number 100 tracking pulses.

It should be understood that the prototype described hereinbefore is only exemplary.

Although the invention has been shown and described with respect to a preferred embodiment thereof, it should be understood by those skilled in the art that various changes and omissions in the form and detail thereof may be made therein without departing from the spirit and the scope of the invention.

Having thus described a typical embodiment of my invention, that which I claim as new and desire to secure by Letters Patent of the United States is:

1. A system for indicating the displacement between relatively movable members of a data element of the type which provides an error signal having associated therewith a positive and negative sign in response to displacement signals representative of indicated displacements between said members which are respectively greater and lesser than the actual displacement therebetween, the amplitude of said error signal being representative of the difference between said indicated and actual displacements, comprising:

control means connected to an input of said data element for providing said displacement signals;

generating means connected to the output of said data element and the input of said control means for causing said displacement signals to change by a known increment in response to said error signal having an amplitude greater than a known amplitude;

digital modification means responsive to said error signal for generating logic signals, each said logic signal being generated upon a signal associated with said error signal remaining unchanged for a predetermined time;

counter means for integrating said logic signals to generate a velocity signal representation of a computed velocity; and pulse generator means connected to the input of said control means and responsive to said velocity signal representation for causing said displacement signals to change at a rate proportional to said computed velocity.

2. Apparatus according to claim 1 wherein said control means causes a change of said indicated displacement in concurrent response to a signal pulse and a direction signal, said generating means comprising:

means for providing a displacement direction signal representative of the sign of said error signal; and means for providing a displacement signal pulse in response to said error signal having an amplitude greater than said known amplitude.

3. Apparatus according to claim 2 wherein the change of said indicated displacement in concurrent response to said displacement signal pulse and said displacement direction signal causes a reduction of the amplitude of said error signal.

4. Apparatus according to claim 2 wherein said counter means comprises:

a counter which provides a velocity signal representation of said computed velocity which is increased in absolute value by a least significant increment in concurrent response to said error signal having an amplitude greater than said known amplitude when said computed velocity has a sign associated therewith which is the same as the sign of said error signal, said representation additionally being of said computed velocity decreased in absolute value by a least significant increment in concurrent response to said error signal having an amplitude greater than said known amplitude when said computed velocity has a sign associated therewith which is the opposite of the sign of said error signal; and means for providing a velocity direction signal representative of the sign of said computed velocity; and wherein said pulse generator means comprises:

means for providing a velocity group of signal pulses, the number of pulses in said velocity group being proportional to said computed velocity.

5. Apparatus according to claim 2 wherein said generating means concurrently provides said displacement direction signal and an override group of signal pulses in response to said error signal having an amplitude greater than an override amplitude.

6. In a system for indicating the displacement between relatively movable members of a data element of the type which provides an error signal having associated therewith a positive and a negative sign in response to displacement signals representative of indicated displacements between said members which are respectively greater and lesser than the actual displacement therebetween, the amplitude of said error signal being representative of the difference between said indicated displacement and the actual displacement, said displacement signals being provided by a control unit which changes said indicated displacement by a smallest resolvable increment in concurrent response to a signal pulse and a direction signal, the improvement comprising:

digital modification means responsive to said error signal for generating logic signals, each said logic signal being generated upon a sign associated with said error signal remaining unchanged for a predetermined time;

counter means for integrating said logic signals to generate a velocity signal representation of a computed velocity, and for providing to said control unit a velocity direction signal representative of the sign of said computed velocity;

generator means connected to the input of said control unit and responsive to said velocity signal representation for providing a group of signal pulses, the number of pulses in said group being proportional to said computed velocity; and means connected to the output of said data element and to the input of said control unit for concurrently providing a displacement direction signal representative of the sign of said difference and a displacement signal pulse in response to said error signal having an amplitude greater than a known amplitude.

* * * * *